United States Patent
Sikora

(10) Patent No.: US 6,498,499 B1
(45) Date of Patent: *Dec. 24, 2002

(54) DEVICE FOR MEASURING THE CAPACITANCE OF ELECTRICAL WIRES

(75) Inventor: Harald Sikora, Bremen (DE)

(73) Assignee: Sikora Industrieelektronik GmbH, Bremen (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,188

(22) Filed: Feb. 19, 1999

(30) Foreign Application Priority Data

Mar. 7, 1998 (DE) .......................... 198 09 890

(51) Int. Cl.⁷ .............................. G01R 27/26
(52) U.S. Cl. .................. 324/661; 324/662; 324/669
(58) Field of Search ................ 324/661, 559, 324/662, 665, 669

(56) References Cited

U.S. PATENT DOCUMENTS

| | | | | |
|---|---|---|---|---|
| 2,802,173 A | * | 8/1957 | Nisle | 324/376 |
| 3,433,858 A | * | 3/1969 | Bauer et al. | 264/212 |
| 3,459,851 A | * | 8/1969 | Mac Pherson | 324/671 |
| 4,095,174 A | * | 6/1978 | Ishido | 324/688 |
| 4,101,827 A | * | 7/1978 | Offner | 324/559 |
| 4,206,402 A | * | 6/1980 | Ishido | 324/688 |
| 4,424,480 A | * | 1/1984 | Stefan | 324/690 |
| 4,449,405 A | * | 5/1984 | Franz et al. | 324/690 |
| 4,594,893 A | * | 6/1986 | Lombard et al. | 324/690 |
| 5,159,276 A | * | 10/1992 | Reddy, III | 324/678 |
| 5,760,590 A | * | 6/1998 | Striffler | 324/514 |
| 6,166,540 A | * | 12/2000 | Wolin | 324/300 |

FOREIGN PATENT DOCUMENTS

| | | |
|---|---|---|
| DE | 3019034 | 4/1981 |
| DE | 1584 31 | 1/1983 |
| EP | 0 679 863 A1 | 3/1995 |
| GB | 2 003 613 A | 3/1979 |

* cited by examiner

Primary Examiner—Michael Sherry
Assistant Examiner—Jermele Hollington
(74) Attorney, Agent, or Firm—Vidas, Arrett & Steinkraus, P.A.

(57) ABSTRACT

The device for measuring the capacitance of electrical wires has a first and a second measuring tube both connected to a voltage source of high frequency. The first measuring tube has a conventional length while the second measuring tube is significantly shorter. With the first measuring tube the capacitance of the wire can be measured in a conventional manner. The second measuring tube allows the measurement of local changes of the capacitance.

14 Claims, 2 Drawing Sheets

DEVICE FOR MEASURING THE CAPACITANCE OF ELECTRICAL WIRES

BACKGROUND OF THE INVENTION

The invention refers to a device for measuring the capacitance electrical wires.

In the manufacture of electrical wires comprising a conductor and an insulating cover or sheathing it is important for the manufacturer to know the capacitance of the wire or cable. As known, the capacitance influences the resistance impedance of the cable.

From GB 2 003 613 it has become known to measure the capacitance of a cable in that a measuring tube of electrically conductive material is provided through which the cable is extend. Preferably, the measuring tube is located in a cooling path and thus is filled with water. A measuring voltage of high frequency is applied to the measuring tube while the conductor is connected to ground. Thereby, a current flows between the measuring tube and the conductor, the current depending upon the dielectric constant of the insulating material and the thickness thereof.

From EP 0 679 863 it has become know to use the mentioned measuring principle to measure the eccentric displacement of the color of a cable within the cover. To this purpose three arcuate electrode segments are arranged about the circumference of the cable. The segments are circumferentially spaced and electrically insulated relative to each other. Each segment or electrode is supplied with a measure voltage of high frequency. The current flowing to the individual electrode segments is a measure-for the thickness of the cover in the area of the electrode segments. In case the currents flowing to the individual electrode segments are different, this is an indication the conductor is not concentrically arranged in the cable cover.

In particular with electrical wires operated with high frequency, e.g. 2 GI-Iz also local changes of the capacitance along the wire may be important. Such change's an be caused by an inhomogeneous structure of the cable or by changes of the thickness. Such changes cause undesired reflections of electromagnetic waves.

It is an object of he invention to provide a device for measuring the capacitance of electrical wires which allows also the measurement of local changes of the capacitance.

SUMMARY OF THE INVENTION

In the device according to the invention a second measuring tube is co axially arranged with respect to a first measuring tube. The length of the second tube is significantly smaller than that of the first tube. The first tube may be comprised of a plurality of individual tube portions. The first tube has to have a minimum length if a precise capacitance measurement is desired. Such minimum length is for example 200 mm. Such a length, however, does not allow a satisfactory resolution in order to determine changes of the capacitance in smaller areas. Therefore, a second significantly short measuring tube is provided which has a length which is for example 10 to 25% of the total length of the first and second measuring tube. Thus, a second tube may have a length between 20 and 50 mm. By means of suitable capacitance measuring means the capacitance between the first measuring tube and the conductor and the capacitance between the second measuring tube and the conductor are measured. It is also possible, in view of the first capacitance values to take the fit and second measuring tubes together and to measure the capacitance between these tubes and the conductor.

The capacitance can be detained in a known manner by the measurement of current or voltage. For example the first and second measuring tube may be connected to separate current measuring devices, and a suitable evaluation device evaluates changes of the current to indicate them as changes of the capacitance. In case the changes reach critical values a corresponding indication can be carried out. Occasionally, a portion of the cable has to be eliminated Another possibility for measuring the capacitance can be carried out by a bridge circuit in that the voltage drop of a known capacitor is measured which is series-connected to the capacitance to be measured, with the circuit being supplied with a known voltage.

In the general measuring of the capacitance the second measuring tube may be excluded. In an alternative case, it is included in that the currents flowing to the first and the second tube are added. In this case a current measuring device may measure the total current flowing to both measuring tubes. The inclusion of the second measuring has the advantage that the total length of a device for measuring the capacitance must not be larger than that of conventional measuring devices.

It is understood that also two or more than two measuring tubes may be provided which occasionally may have different length in order to achieve the desired degree of resolution. The local resolution increases with a decrease of the length of the measuring tube, however, the disturbing effects also increase with decreasing length so that the danger exist that with particular short second tubes no usable measuring results can be achieved.

In a particular embodiment of the invention the second measuring tube is located between at least two portions of the first measuring tube. Such an arrangement has the advantage that the disturbing fields effecting on the second measuring tubs are minimal so that changes of the capacitance can be particularly precisely measured.

Preferably, the second measuring tube has the same diameter as the first measuring tube, and both measuring tubes are preferably surround by a common screening tube. An insulation of a solid material can be provided between the screening tube and the measuring tubes which interconnects both parts forming an integral body. Additionally, a second screening tube connected to ground may surround the' first screening tube and forms a unit with the other parts of the device.

BRIEF DESCRIPTION OF THE DRAWINGS

The invention is hereinafter described in more detail by way of drawings.

DETAILED DESCRIPTION OF THE INVENTION

Figure 1:
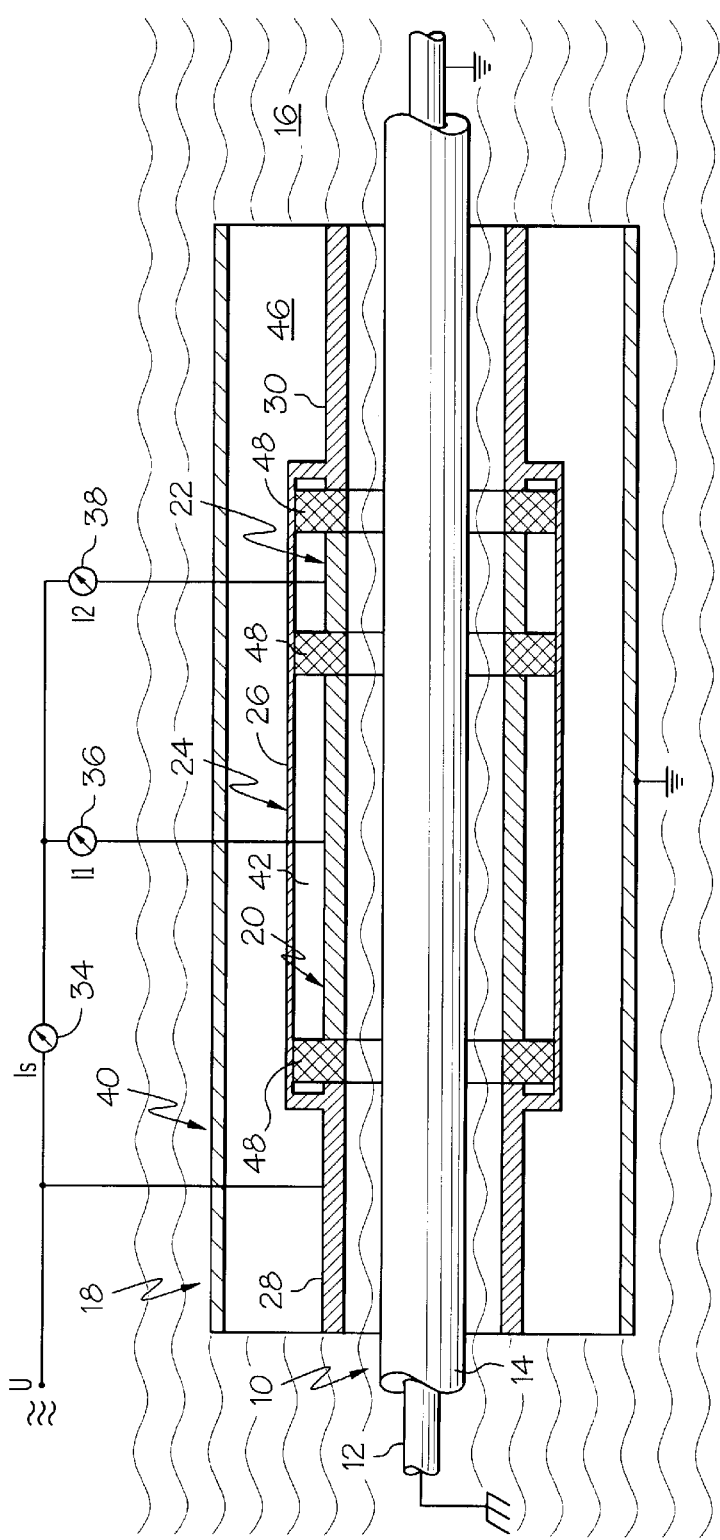
FIG. 1 shows diagrammatically a second embodiment of a device according to the invention.

In FIG. 1 a wire 10 is shown comprising a conductor 12 and a sheathing or cover 14 of electrically insulating material, the wire being extended through a water bath 16 of a cooling path in a cable production plant not shown. A measuring body 18 is located in the bath 16. It includes a first measuring tube 20 which for example has a first length of 200 mm. A second measuring tube 22 having the same diameter as the first measuring tube is located with a small space with respect to the first measuring tube 20 and has for example a second length of 25 mm. First and second tube are coaxially arranged. The tubes 20, 22 made of electrically conductive material are surrounded by a screening tube 24 of conductive material at a radial distance. The screening tube 24 has medium portion 26 which surrounds the tubes 20, 22 at a radial distance and two end portions 28, 30 having a smaller diameter which substantially corresponds to the diameter of the measuring tubes 20, 22. Measuring tubes 20, 22 and screening tube 24 are connected to a measuring voltage U of high frequency, e.g. 450 kHz. The peak voltage is for example 20 V. A first current measuring device 34 is provide in the line to the measuring tubes 20, 22. In the line to the first measuring tube 20 a second current measuring device 36 is provided. A third current measuring device 38 is provided in the line to the second measuring tube. The conductor 12 is connected to ground, also a second screening tube 40 which surrounds the first screening tube 24 at a radial distance. An insulating layer 42, 44, respectively, is located between the measuring tubes 20, 22 on the one side and the first tube 24 on the other side. This is not particularly indicated. It may consist of air. An insulating layer 46 is located between the screening tube 24 and the screening tube 40. As to this, it can be compared with insulating layer 42. The parts described are interconnected and form a uniform measuring body 18. Annular insulating parts 48 are located between the insulating layers 42, 44 and between them and the insulating body 46.

In case a measuring voltage is supplied, a current flows from the measuring tubes 20, 22 to conductor 12. This is a measure of the capacitance of the wire 10. In case the currents 11 and 12 of the measuring devices 36, 38 are summed a measure for the capacitance is achieved. The capacitance can be also measured in that the current measuring device 34 measures current Is. The current 12 measuring device 38 changes if during the forward movement of wire 10 in direction of arrow 48 the capacitance temporarily changes thus local changes of the capacitance exist. Measured changes of the current thus indicate changes of the capacitance which possibly may be critical for causing high reflections of electromagnetic waves in the wire produced.

Figure 2:
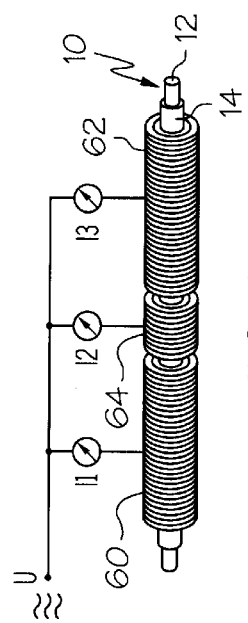
FIG. 2 shows extremely diagrammatically a second embodiment according to the invention capacitance.

In FIG. 2 a diagrammatically depicted arrangement of measuring tubes is indicated. One recognizes two tube portions 60, 62 which have a total length of 200 mm. They are somewhat spaced with respect to each other. A short measuring tube 64, .eg. of 20 to 50 mm length is located in the space between the first tube portions. The tube portions 60 to 64 are supplied with a measuring voltage of high frequency as explained in connection with FIG. 1. In the supply lines to the individual measuring tube portions 60, 62 a current measuring device is connected by which the current T1, T2, and T3 are measured. The sum of these currents can be used for the measuring of the capacitance. The changes of current T2 are an indicator for the changes of the capacitance.

It is understood that in the arrangement of FIG. 2 a similar structure can be choosen as indicated in FIG. 1. Therefore, the screening are not shown.

Figure 3:
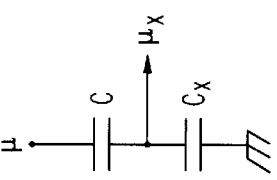
FIG. 3 shows diagrammatically an electrical circuit for measuring capacitance.

The circuit of FIG. 3 shows a capacitor C of known capacitance which is series connected to the capacitor C. The latter is formed by the portion between the measuring tube portion, e.g. portion 20 or portion 22, respectively, and conductor 12. This capacitance is to be measured. The series connection is supplied with the voltage U of high frequency, the amount thereof is also known. At a point between the capacitors C and $C_x$ the voltage $U_x$ is measured. Thereafter, the capacitance $C_x$ to be measured can be calculated along the following formula:

$$C_x = \frac{(U - U_x)C}{U_x}$$

Figure 4:
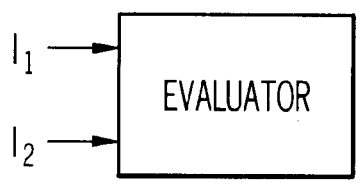
FIG. 4 shows the currents I1 I2 being input to an evaluator which determines the capacitance of wire 10.
Figure 5:
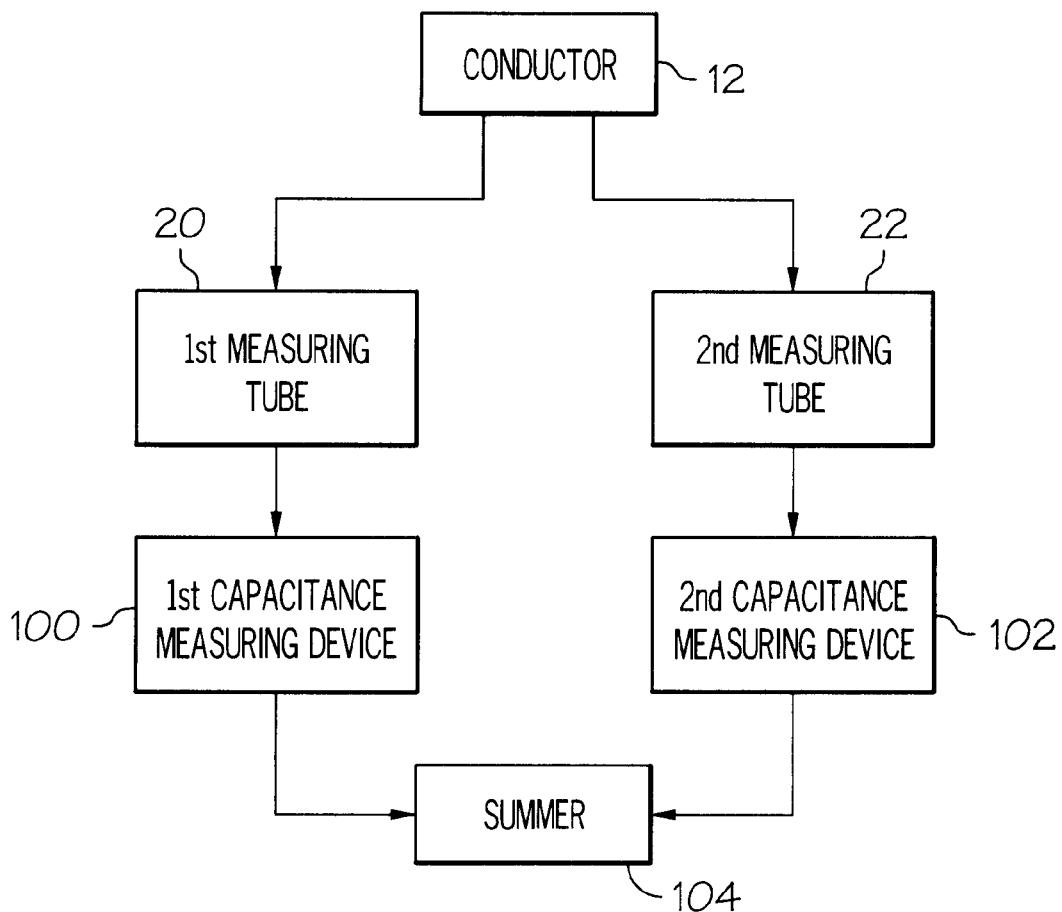
FIG. 5 shows a schematic block diagram of the inventive system.

Referring now to FIGS. 4 and 5, the measured values of currents T1 and T2, as measured by current measuring devices 36 and 38 are shown input to evaluator 100. The evaluator 100 determines the capacitance of the length of cable 12 inside measuring tube 20, as is well known to one of ordinary skill in the art based on a known voltage, and measured current T1. The evaluator also determines the capacitance of the shorter length of cable 12 inside measuring tube 22, as is well known to one of ordinary skill in the art based on the known voltage, and measured current 12. As is well known to those of ordinary skill in the art, the measured capacitance of a length of cable per unit of length can be computed by dividing the measured capacitance of the length of cable by the length of the cable (i.e. pF/feet). The evaluator 100, based on the known lengths of measuring tubes 20 and 22 computes the capacitance of cable 12 per unit length. A difference between the capacitance per unit length based on measuring tube 20 and the capacitance per unit length based on measuring tube 22 indicates local changes of the capacitance of the electrical cable. FIG. 5 schematically shows conductor 12 passing simultaneously through measuring tubes 20 and 22. First and second capacitance measuring devices 102 and 104 measure the capacitance of the respective lengths of cable 12 within the measuring tubes 20 and 22. The evaluator 100 then computes the capacitance per unit length of cable 12 for both measuring tubes 20 and 22, and any differences between these values indicates local changes of the capacitance of the electrical cable. As is discussed above, the first and second capacitance measuring devices maybe based on the measured current The measured capacitance may also be based on a bridge circuit in tat the voltage drop of a known capacitor C is measured, which is series connected to the capacitance to be measured (C,), with the circuit being supplied with a known voltage (U) (see FIG. 3).

What is claimed is:

1. A device for measuring the capacitance of electrical cables having an inner conductor and an insulating cover, the device comprising at least a first measuring tube of electrically conductive material having a first length and at least a second tube located coaxially with respect to the first tube and having a second length which is significantly smaller than the first length, both measuring tubes being adapted to be connected to a measuring voltage source of high frequency, the cable being moved through first and second tubes, a screening tube which surrounds said measuring tubes in radially spaced relationship and being also adapted to be connected to the voltage source, water located between said cable and the measuring tubes, a first capacitance measuring means which measures the capacitance between said first measuring tube and said conductor and a second capacitance measuring means which measures the capacitance between said second measuring tube and the conductor, both the first capacitance measuring device and the second capacitance measuring device simultaneously measuring the capacitance of the respective lengths of cable surrounded by the first and second measuring tubes and wherein differences between the measured capacitance of the first and second capacitance measuring means indicate local changes of the capacitance of the electrical cable.

2. The device of claim 1, wherein the capacitances are measured by means of a measuring bridge circuit in that a voltage drop of a known capacitor is compared with a voltage drop of an unknown capacitance to be measured in a series connection with the known capacitor.

3. The device of claim 1, wherein a first current measuring device measures the current between the said first measuring tube and and the conductor, and a second current measuring device measures the current between said second measuring tube and the conductor, and an evaluating means evaluates the current in said first and second measuring devices in order to indicate the capacitance and the changes of the capacitance.

4. The device of claim 1, wherein said first and second measuring tubes have the same diameter.

5. The device of claim 1, wherein said first and second measuring tubes are surrounded by a common screening tube.

6. The device of claim 1, wherein said first measuring tube has two spaced tube portions and said second measuring tube is located between the tube portions.

7. The device of claim 1, wherein portions of said screening tube extend beyond said measuring tubes, with said portions having approximately the same diameter as said measuring tubes.

8. The device of claim 1, wherein said screening tube is surrounded by a second screening tube radially spaced from said first screening tube, the second screening tube being connected to ground.

9. The device of claim 1, wherein said measuring tubes and said screening tube form an integral body and are interconnected by an insulation layer.

10. The device of claim 1 wherein the first and second capacitance measuring means measures the capacitance of the cable with an evaluator by measuring the current flowing between the first measuring tube and the conductor and given a known supply voltage and by measuring the current flowing between the second measuring tube and the conductor and given the known supply voltage, the evaluator determining the capacitance per unit length of the cable for both the first and second measuring tubes.

11. The device of claim 1 wherein the first and second capacitance measuring means measures the capacitance of the cable inside the first and second measuring tubes using a bridge circuit and an evaluator which compares the capacitance to be measured with a known capacitance and computes the measured capacitance given a known supply voltage.

12. The device of claim 1, wherein said second measuring tubes has a length which is between 10 and 25% of the total length of said first and said second measuring tube.

13. The device of claim 12, wherein the total length of said first and said second measuring tube is approximately 220 mm.

14. The device of claim 12, wherein the length of said second measuring tube is between 20 and 50 mm.

* * * * *